(12) United States Patent
Lin et al.

(10) Patent No.: US 7,672,122 B2
(45) Date of Patent: Mar. 2, 2010

(54) FLASH MEMORY DISK WITH ROTATABLE AND TELESCOPIC PROTECTION STRUCTURE AND METHOD USING THE SAME

(75) Inventors: Wei-Hung Lin, Miaoli County (TW); Yu-Ting Tseng, Hsinchu County (TW); Hung-Yi Chung, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 53 days.

(21) Appl. No.: 12/033,278

(22) Filed: Feb. 19, 2008

(65) Prior Publication Data

US 2009/0122478 A1 May 14, 2009

(30) Foreign Application Priority Data

Nov. 8, 2007 (TW) ................. 96218828 U (51) Int. Cl.
*H05K 5/00* (2006.01)
(52) U.S. Cl. ............................ 361/679.31; 361/679.39; 439/142
(58) Field of Classification Search ............ 361/679.31, 361/679.39; 439/142
See application file for complete search history.

(56) References Cited

U.S. PATENT DOCUMENTS

| 7,473,112 B2* | 1/2009 | Zhu et al. ............... 439/142 |
| 2006/0002069 A1* | 1/2006 | Chuang ............... 361/683 |
| 2008/0278902 A1* | 11/2008 | Nguyen et al. ............ 361/684 |

\* cited by examiner

*Primary Examiner*—Jayprakash N Gandhi
*Assistant Examiner*—Ingrid Wright
(74) *Attorney, Agent, or Firm*—J.C. Patents (57) ABSTRACT

A flash memory disk includes a holder, a plug, a housing and a pulling ring. The plug is joined with the holder and exposed out of the holder. The housing has a containing space for accommodating the holder and the plug, wherein two sides opposite to each other respectively have a through sliding groove and the third side of the housing there has an opening. The two arms of the pulling ring have sliding blocks, and the sliding blocks are moveable and matched with the through sliding grooves, wherein the pulling ring is rotated about the axis connecting both the sliding blocks, and when the sliding blocks of the pulling ring is moved, the holder would be located between a first position where the plug is entirely accommodated in the containing space and a second position where the plug is entirely protruded out of the opening.

16 Claims, 7 Drawing Sheets

FIG. 7

FLASH MEMORY DISK WITH ROTATABLE AND TELESCOPIC PROTECTION STRUCTURE AND METHOD USING THE SAME

CROSS-REFERENCE TO RELATED APPLICATION

This application claims the priority benefit of Taiwan application serial no. 96218828, filed on Nov. 8, 2007. The entirety of the above-mentioned patent application is hereby incorporated by reference herein and made a part of this specification.

BACKGROUND

1. Technology Field

The present invention generally relates to a flash memory disk, and more particularly, to a flash memory disk with a rotatable and telescopic protection structure.

2. Description of Related Art

Along with the multimedia boom today, a required file has bigger and bigger size. A floppy disk with 1.44 MB capacity is convenient for carrying but its size is too small to be accepted by customers; a hard disk of computer has large capacity but is inconvenient for carrying. In recent years, as the USB (universal serial bus) interfaces are popularized and flash memories become more cheaper, a flash memory disk having large capacity, friend compatibility and carrying convenience has been newly developed, so as copying data between different computers.

Although the flash memory disk with its significant features of large capacity, Plug-and-Play (PnP), compact size and carrying convenience has gradually substituted a out-of-date floppy disk; however, the flash memory disk uses a plug for electrically connecting different computers, such as notebook computers, therefore, how to protect the plug from collision and damage to keep the electrical conductance function thereof is an important task for the relevant manufactures.

SUMMARY OF THE INVENTION

Accordingly, the present invention is directed to a flash memory disk having a rotatable and telescopic structure for protecting the plug thereof.

The present invention provides a structure for a flash memory disk. The structure includes a holder, a plug, a housing and a pulling ring. The holder is for disposing a storage device therein. The plug is joined with the holder and exposed out of the holder. The plug is electrically connected to the storage device. The housing has a containing space for accommodating the holder and the plug, wherein two sides opposite to each other of the housing respectively have a through sliding groove and a third side of the housing has an opening. The pulling ring has two arms, each of the arms has a sliding block moveably and matched with the corresponding through sliding groove. In particular, the pulling ring herein is rotatable relatively to the housing about an axis connecting both sliding block, wherein when the sliding blocks of the pulling ring slide along the through sliding grooves, the plug with the sliding blocks together slides relatively to the housing between a first position and a second position; when the plug is located at the first position of the housing, the plug is entirely accommodated inside the containing space; when the plug is located at the second position of the housing, the plug is entirely protruded out of the opening.

According to the embodiment of the present invention, the above-mentioned flash memory disk includes at least a holder string strip disposed on at least a side wall of the holder and includes a second holder bump and a third holder bump, wherein at the least one of the sliding blocks is located between the second holder bump and the third holder bump. When the holder is located at the first position and the sliding blocks of the pulling ring are sliding along the through sliding groove towards the side where the opening is located at, said at the least one of the sliding blocks would push the second holder bump to enable the holder moving towards the opening.

According to the embodiment of the present invention, when the above-mentioned holder is located at the second position and the sliding blocks of the pulling ring are sliding along the through sliding groove departing from the side where the opening is located at, said at the least one of the sliding blocks would push the third holder bump to enable the holder moving towards the containing space.

According to the embodiment of the present invention, the above-mentioned holder string strip further includes a first holder bump disposed thereon, the first holder bump is located between the second holder bump and the plug, and the housing further has at least a housing bump facing the side wall of the holder string strip and disposed at the side where the through sliding groove is located at. The housing bump is located between the first holder bump and the opening when the holder herein is located at the first position, and the housing bump is located between the first holder bump and the second holder bump when the holder is located at the second position.

According to the embodiment of the present invention, a side facet of the above-mentioned holder bump facing the plug has a chamfer, so that the housing bump is locked between the first holder bump and the second holder bump while said at the least one of the sliding blocks pushes the second holder bump and the first holder bump touches the housing bump.

According to the embodiment of the present invention, a side facet of the above-mentioned third holder bump facing the plug has a chamfer, so that the holder string strip swings by an angle and the housing bump is unlocked from the first holder bump while said at the least one of the sliding blocks pushes the third holder bump.

According to the embodiment of the present invention, the holder string strip is an elastic plastic strip or an elastic metal strip.

According to the embodiment of the present invention, the storage device is a flash memory storage device.

According to the embodiment of the present invention, the above-mentioned plug is a USB plug or an IEEE-1394 plug (FireWire plug).

According to the embodiment of the present invention, the pulling ring is U-shape.

According to the embodiment of the present invention, the through sliding grooves are disposed at the upper-down sides of the housing.

According to the embodiment of the present invention, the through sliding grooves are disposed at the left-right sides of the housing.

According to the embodiment of the present invention, the holder further forms a hole which could accommodate a sliding block.

In addition, the present invention also provides a method for using the above-mentioned flash memory disk. The method includes following steps: placing the plug and the holder in the housing; pulling the pulling ring to be moved towards the opening so as to protrude the plug out of the housing through the opening; rotating the pulling ring so as to avoid the electrical connection between the plug and the host from being affected.

According to the embodiment of the present invention, the method further includes fixing the pulling ring.

Since the flash memory disk of the present invention has a rotatable and telescopic structure, therefore, the plug of the flash memory disk is effectively protected, and moreover, the opening, which is exposed when the plug is shrunk back into the housing of the flash memory disk, is effectively protected as well.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
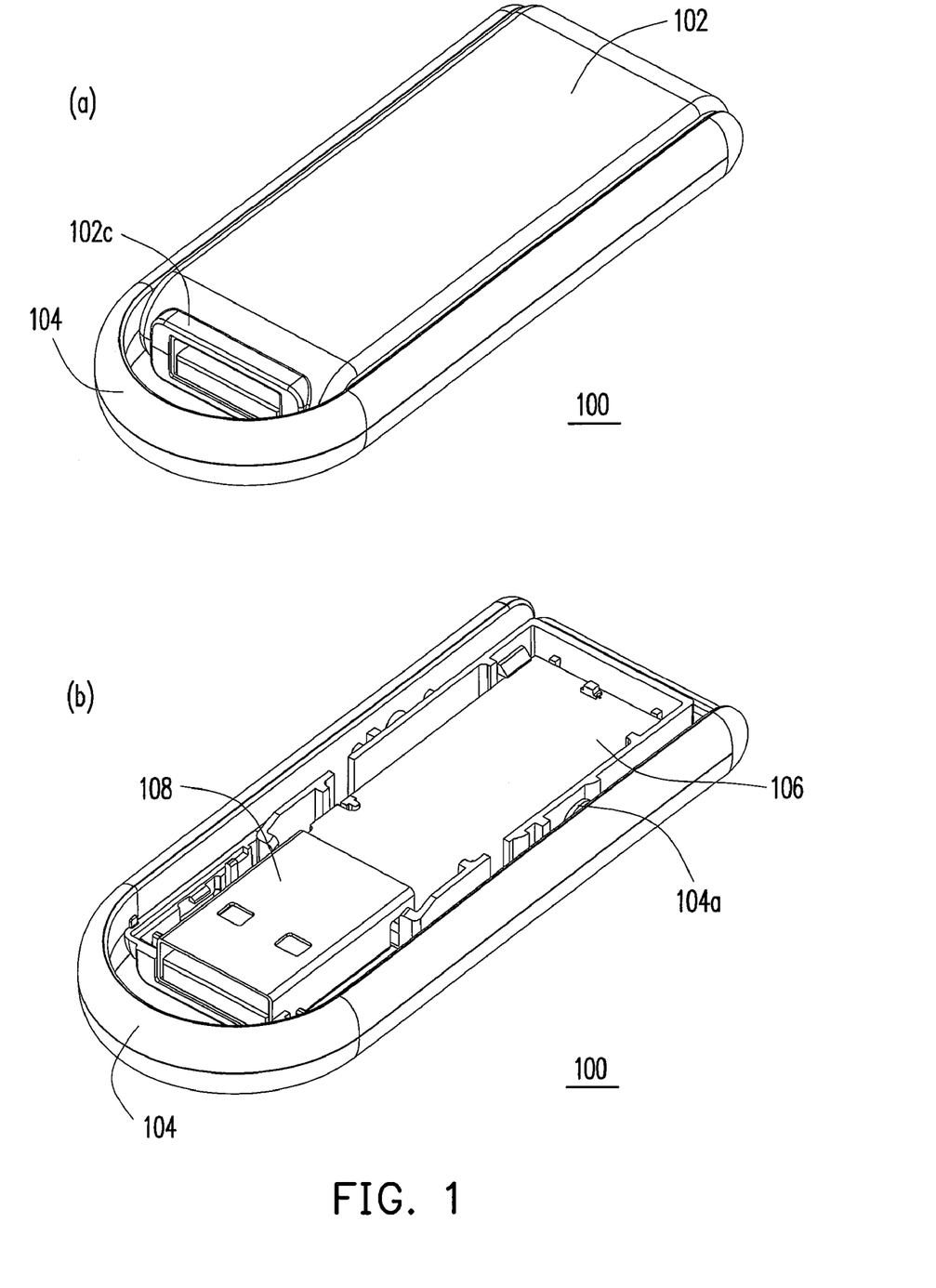
FIG. 1 is a diagram and a schematic 3D-top-view of a flash memory disk according to an embodiment of the present invention.

FIG. 1 is a diagram and a schematic 3D-top-view of a flash memory disk with a rotatable and telescopic structure according to an embodiment of the present invention.

Referring to FIG. 1, a flash memory disk 100 includes a housing 102, a pulling ring 104, a holder 106 and a plug 108.

Inside the housing 102 a containing space is available for accommodating the holder 106 and the plug 108. A side of the housing 102 has an opening 102c, wherein the plug 108 located inside the housing 102 is able to protrude out of the housing 102 or be shrunk back into the housing 102 through the opening 102c.

Figure 4:
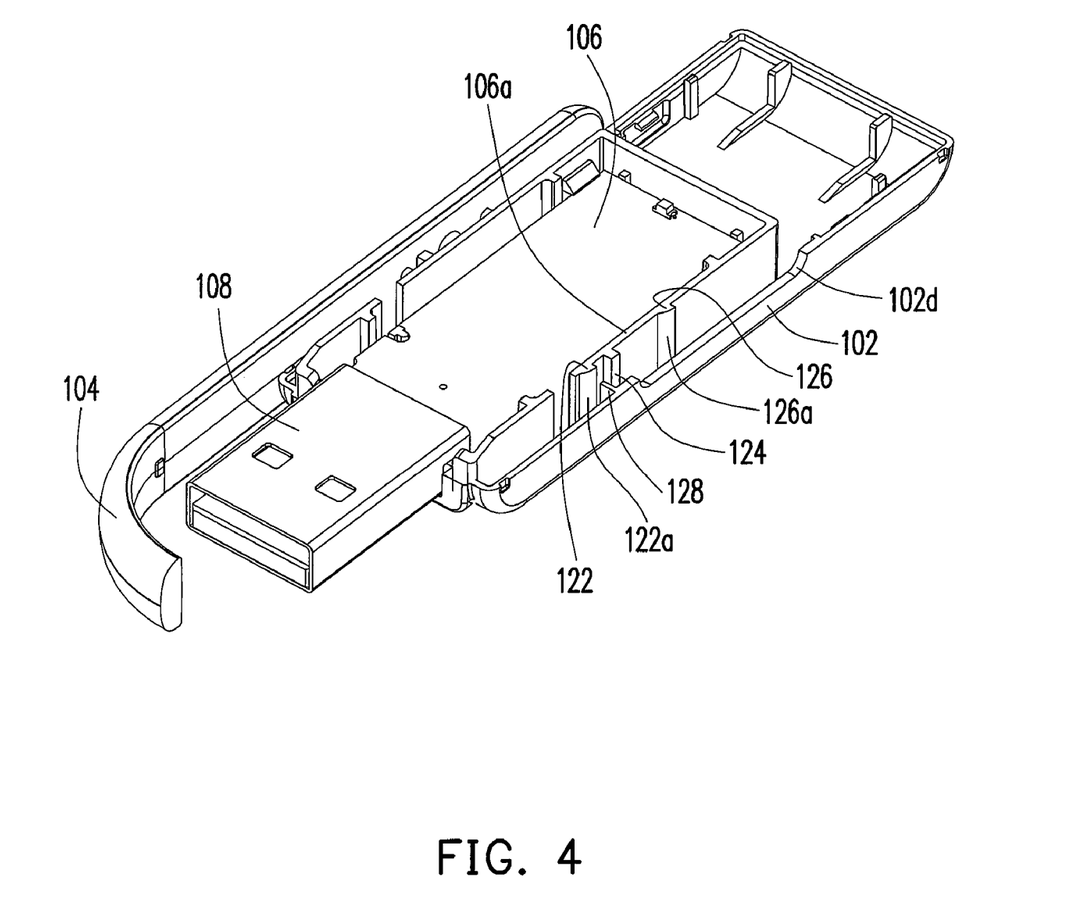

The pulling ring 104 is moveably disposed on the housing 102. In more detail, two arms of the pulling ring 104 respectively have a sliding block 104a, two sides opposite to each other of the housing 102 have a through sliding groove 102d and the through sliding grooves 102d are matched with the through sliding grooves 102d of the housing 102 (as shown in FIG. 4). In the embodiment, the pulling ring 104 is designed to be a U-shape, but the pulling ring 104 certainly has other shapes, for example, a V-shape, or is a device with a rotatable and telescopic structure relatively to the housing 102. Moreover, for the purpose of pulling ring to move and rotate relatively to the housing 102, in another embodiment, the holder 106 formed a hole (no shown) which could accommodate a sliding block 104a, wherein when the pulling ring 104 slide along the through sliding grooves 102d, the holder 106 moves between a first position and a second position.

The holder 106 provides a containing space for accepting a storage device. In the embodiment, the storage device is a flash memory storage device. However, the disposed storage device can be others, for example, a solid hard disk or other storage devices.

The plug 108 is joined with the holder 106 and exposed out of the holder 106, and the plug 108 further is electrically connected to the storage device in the holder 106. In the embodiment, the plug 108 is a USB interface, but can be an IEEE-1394 interface or other a suitable interface as well.

Figure 2:
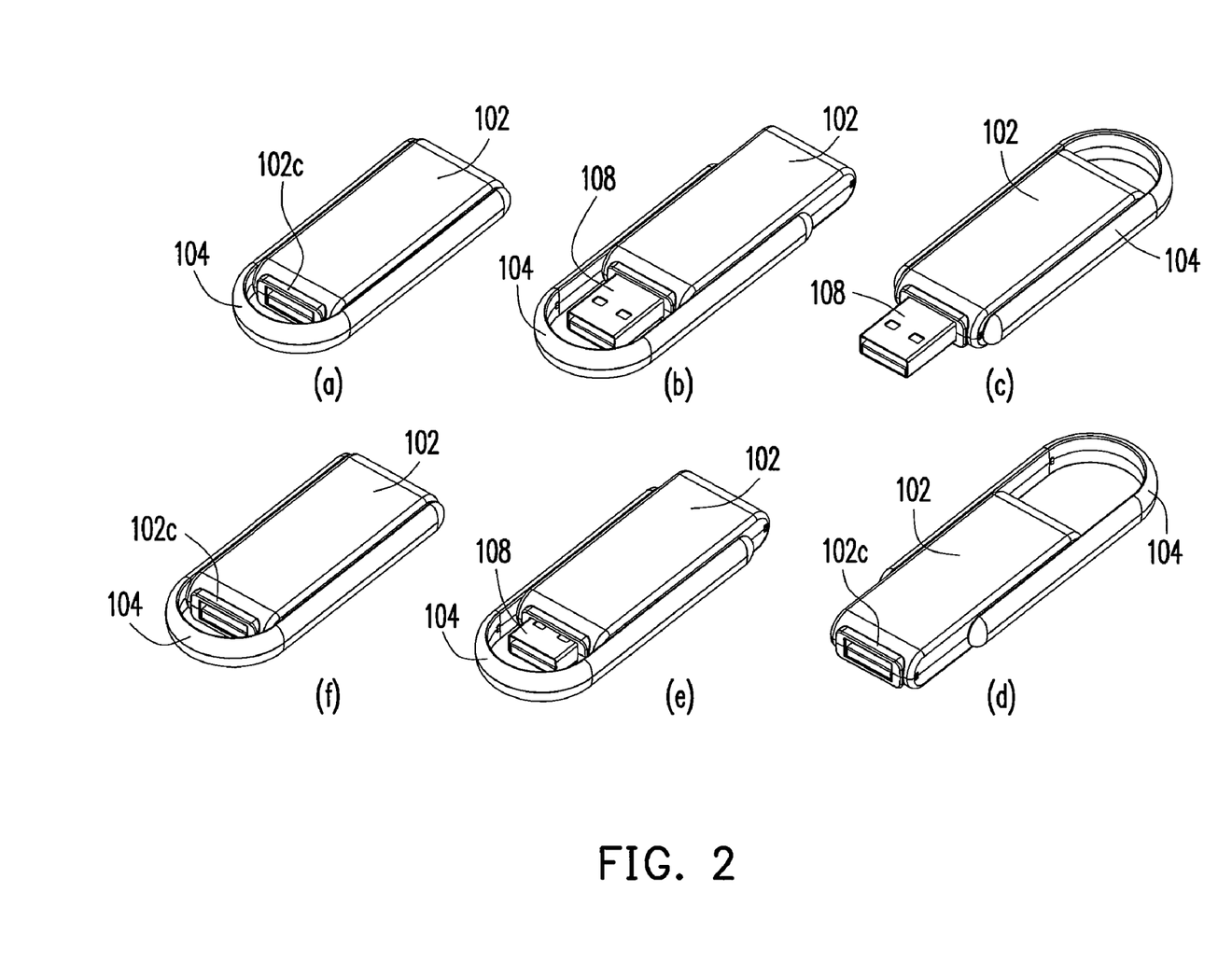
FIG. 2 is a diagram showing the operation of a flash memory disk according to an embodiment of the present invention.

FIG. 2 is a diagram showing the operation of a flash memory disk with a rotatable and telescopic structure according to an embodiment of the present invention.

In FIG. 2, (a)-(f) illustrate different operation stages of the flash memory disk according to an embodiment of the present invention. In (a) of FIG. 2, the holder 106 together with the plug 108 is located at a first position and entirely accommodated in the housing 102. At the time, the U-shape pulling ring 104 is allowed to slide towards the opening 102c of the housing 102 so that the holder 106 and the plug 108 take a second position and the plug 108 is protruded entirely out of the opening 102c, as shown in (b) of FIG. 2. The U-shape, pulling ring 104 is able to rotate about an axis connecting both the sliding blocks 104a relatively to the housing 102, as shown in (c) of FIG. 2. At the stage, the protruded plug 108 of the flash memory disk 100 can be plugged into a jack of a host (not shown) to allow accesses to and from the storage device in the housing 102.

Similarly, after finishing using the flash memory disk 100 as shown in (c) of FIG. 2, the pulling ring 104 slides departing from the opening 102c of the housing 102 so that the holder 106 and the plug 108 take the first position and are accommodated entirely in the housing 102, as shown in (d) of FIG. 2. Then, the U-shape pulling ring 104 is rotated about the axis connecting both the sliding blocks relatively to the housing 102 so as to protect the opening 102c, as shown in (f) of FIG. 2.

Note that to shrink back the plug 108, the U-shape pulling ring 104 can be alternatively rotated about the axis connecting both the sliding blocks 104a, as shown in (e) of FIG. 2, following by moving the U-shape pulling ring 104 departing from the opening 102c of the housing 102 so as to make the plug 108 shrunk back entirely in the housing 102, as shown in (f) of FIG. 2. In this way, the plug 108 is protected not only by the housing 102, but also by the U-shape pulling ring 104, which would avoid the opening 102c providing a path for moving the plug 108 to break the appearance integrity of the flash memory disk.

FIGS. 3-6 are 3D drawings respectively illustrating a flash memory disk of FIG. 2 corresponding to different stages of the operation according to an embodiment of the present invention.

Figure 3:
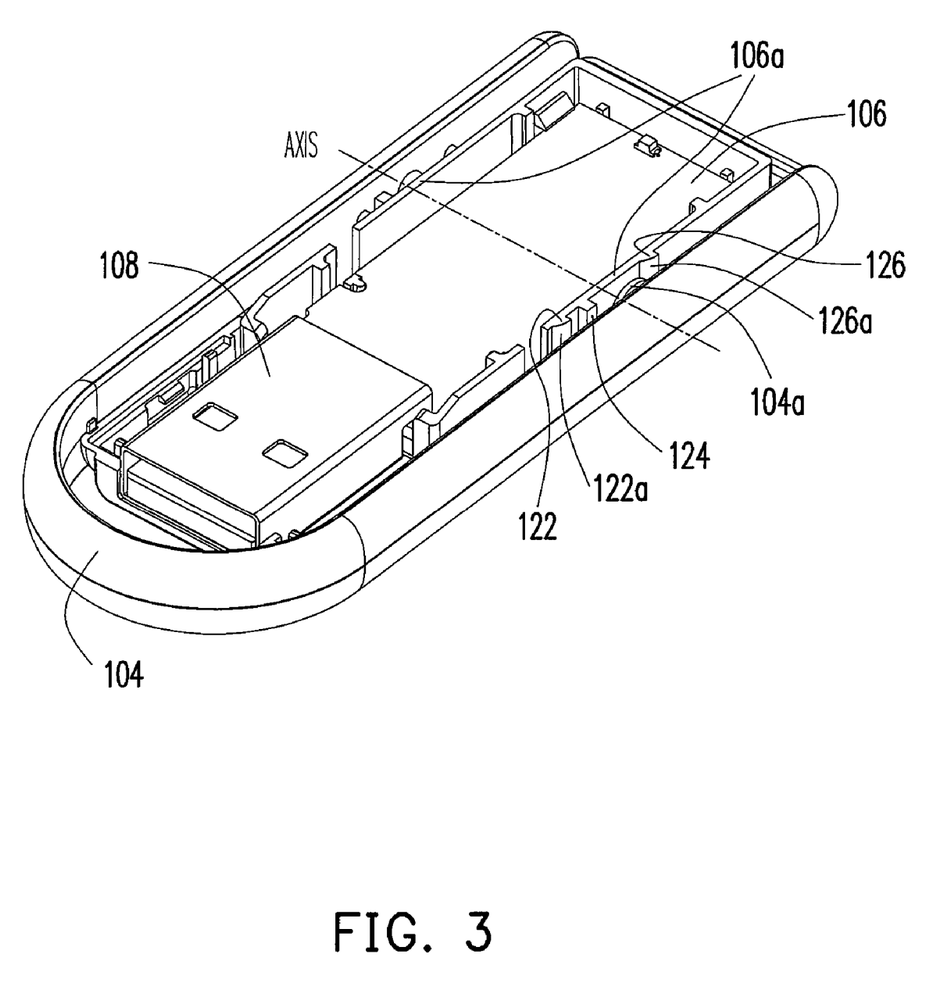
FIGS. 3-6 are 3D drawings respectively illustrating a flash memory disk corresponding to different stages of the operation according to an embodiment of the present invention.

FIG. 3 is a partial 3D drawing of the flash memory disk corresponding to the stage of (a) in FIG. 2.

Referring to FIGS. 3 and 4, two holder string strips 106a are respectively disposed on two side walls of the holder 106, wherein the two side walls face the through sliding groove 102d of the housing 102. In the embodiment, the holder string strip 106a is an elastic plastic strip extended from the side wall of the holder 106, but the holder string strip 106a may be an elastic metal strip extended from the side wall of the holder 106 as well.

The holder string strip 106a includes a first holder bump 122, a second holder bump 124 and a third holder bump 126, wherein the second holder bump 124 is more close to the plug 108 than the third holder bump 126 and the first holder bump 122 is more close to the plug 108 than the second holder bump 124. In other words, the third holder bump 126, the second holder bump 124 and the first holder bump 122 are sequentially arranged on the holder string strip 106a in a direction towards the plug 108. In addition, the sliding blocks 104a of the U-shape pulling ring 104 are located between the second holder bump 124 and the third holder bump 126.

The housing 102 further has a housing bump 128 disposed at the side thereof where the through sliding groove 102d is located at and on the side wall thereof facing the holder string strip 106a, wherein when the holder 106 takes the above-mentioned first position, the housing bump 128 is located between the first holder bump 122 and the opening 102c.

When the sliding blocks 104a of the U-shape pulling ring 104 slide along the through sliding grooves towards the side where the opening 102c is located at, the sliding blocks 104a push the second holder bump 124 so as to move the holder 106 towards the opening 102c.

FIG. 4 is a partial 3D drawing of the flash memory disk corresponding to the stage of (b) in FIG. 2.

Referring to FIG. 4, after the sliding blocks 104a of the U-shape pulling ring 104 slide along the through sliding groove 102d and towards the side where the opening 102c is located at, the holder 106 with the plug 108 together is located at the above-mentioned second position, i.e., the plug 108 is entirely protruded out of the housing 102. At the time, the housing bump 128 is located between the first holder bump 122 and the second holder bump 124.

Note that a side facet facing the plug 108 of the first holder bump 122 is made as a chamfer 122a in the embodiment. When the sliding blocks 104a of the U-shape pulling ring 104 slide along the through sliding grooves 102d and towards the side where the opening 102c is located at, the housing bump 128 on the housing 102 would touch the first holder bump 122 and the chamfer 122a would be locked between the first holder bump 122 and the second holder bump 124, so that the plug 108 is fixed solidly.

Figure 5:
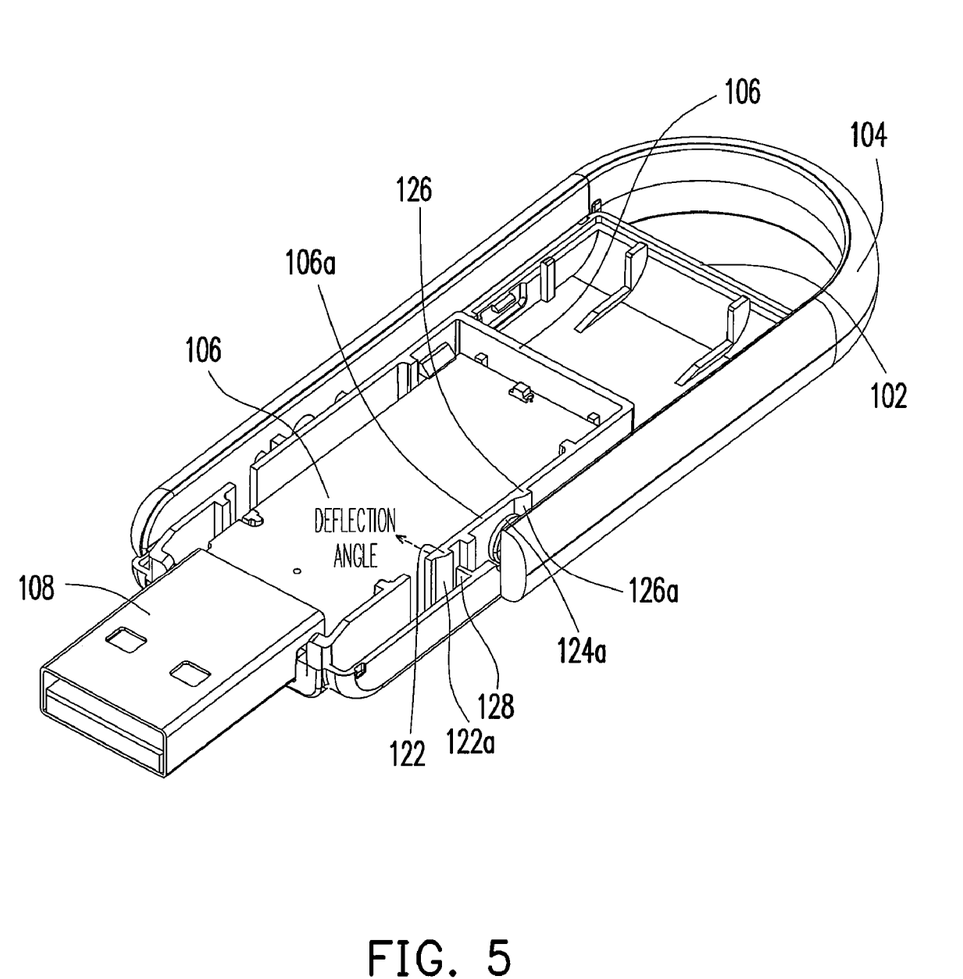

FIG. 5 is a partial 3D drawing of the flash memory disk corresponding to the stage of (c) in FIG. 2.

Referring to FIG. 5, after the U-shape pulling ring 104 is rotated about the axis connecting both the sliding blocks 104a, the plug 108 is exposed, so that the user may insert the plug 108 of the flash memory disk 100 into a host (not shown) for access.

When the flash memory disk is at the stage of (c) of FIG. 2, when the user moves the sliding blocks 104a of the U-shape pulling ring 104 along the through sliding groove 102d and departing from the side where the opening 102c is located at, the third holder bump 126 would be pushed, so that the holder 106 with the plug 108 together moves towards the containing space of the housing 102.

Note that a side facet of the third holder bump 126 facing the plug 108 is made as a chamfer 126a. When the sliding blocks 104a of the U-shape pulling ring 104 slide along the through sliding grooves 102d and departing from the side where the opening 102c is located at, the sliding blocks 104a would touch the chamfer 126a of the third holder bump 126 and the holder string strip 106a would swing by an angle to unlock the housing bump 128 from the first holder bump 122, so that the holder 106 with the plug 108 together is allowed to move towards the containing space of the housing 102.

Figure 6:
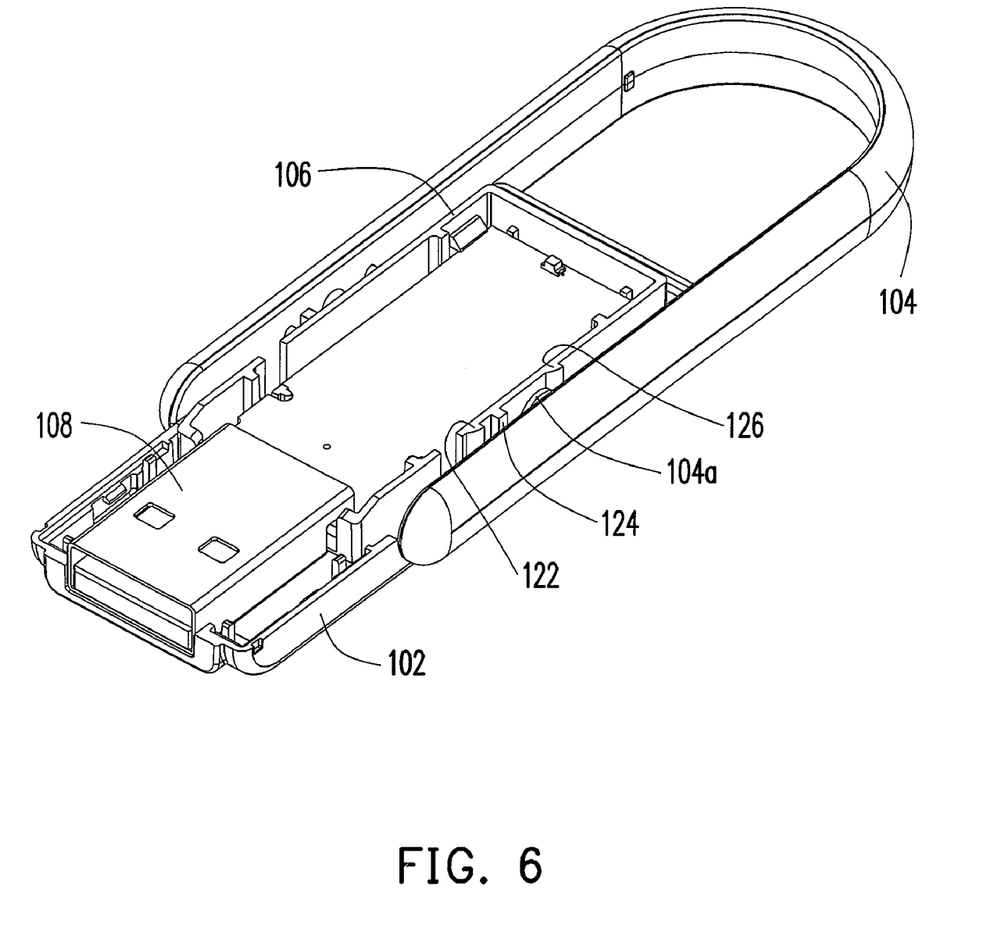

FIG. 6 is a partial 3D drawing of the flash memory disk corresponding to the stage of (d) in FIG. 2.

Referring to FIG. 6, after the flash memory disk 100 continuously moves from the second position of FIG. 5 to the first position, the holder 106 with the plug 108 together takes the first position and entirely accommodated in the housing 102.

Thereafter, the U-shape pulling ring 104 is rotated back about the axis connecting both the sliding blocks 104a so as to protect the opening 102c, as shown in (f) of FIG. 2.

Although in the embodiment two holder string strips 106a and the corresponding housing bumps 128 are employed and disposed at both sides of the holder 106, however, the present invention allows to employ a holder string strip and a corresponding housing bump disposed at one of the two sides of the holder.

In addition in the embodiment, the through sliding grooves of the housing, the sliding blocks of the U-shape pulling ring 104 and the holder string strips of the holder are arranged at the left-right sides of the flash memory disk, but the present invention allows to arrange them at the upper-down sides of the flash memory disk as well.

Figure 7:
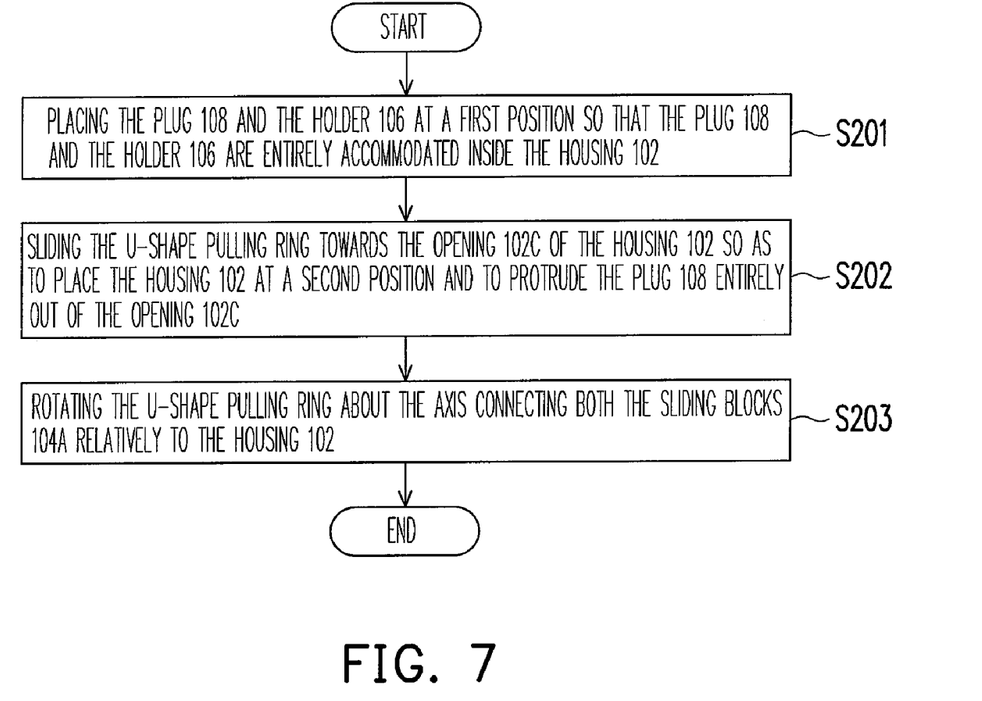
FIG. 7 is a flowchart of the method for using the flash memory disk according to an embodiment of the present invention.

FIG. 7 is a flowchart of the method for using the flash memory disk 100 according to an embodiment of the present invention.

Referring to FIGS. 7, 2 and 3, the method for using the flash memory disk 100 includes following steps: at step S201, placing the plug 108 and the holder 106 at a first position so that the plug 108 and the holder 106 are entirely accommodated inside the housing 102; at step 202, sliding the U-shape pulling ring towards the opening 102c of the housing 102 so as to place the housing 102 at a second position and to protrude the plug 108 entirely out of the opening 102c; at step S203, rotating the U-shape pulling ring about the axis connecting both the sliding blocks 104a relatively to the housing 102 so that the exposed plug 108 of the flash memory disk 100 can be connected to a host (not shown) for accesses to and from the storage device in the holder 106.

In summary, the flash memory disk of the present invention has a rotatable and telescopic structure, so that the plug of the flash memory disk is protected by the housing when the flash memory disk is placed back, and the exposed opening of the housing is protected by the rotatable pulling ring when the plug is shrunk back.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory disk, comprising:
a holder for placing a storage device;
a plug, joined with the holder, exposed out of the holder and electrically connected to the storage device;
a housing, having a containing space for accommodating the holder and the plug, wherein two sides opposite to each other of the housing respectively have a through sliding groove and another side of the housing has an opening; and
a pulling ring, having two arms, wherein the two arms respectively have a sliding block moveably matched with the through sliding grooves,
wherein the pulling ring is rotatable relatively to the housing about an axis connecting both the sliding blocks,
wherein when the sliding blocks of the pulling ring slide along the through sliding grooves, the holder moves between a first position where the plug is entirely accommodated inside the containing space and a second position where the plug is entirely protruded out of the opening.

2. The flash memory disk according to claim 1, further comprising:
   at least a holder string strip, disposed on at least a side wall of the holder and comprises a second holder bump and a third holder bump, wherein at the least one of the sliding blocks is located between the second holder bump and the third holder bump,
   wherein when the holder is located at the first position and the sliding blocks of the pulling ring are sliding along the through sliding groove towards the side where the opening is located at, said at the least one of the sliding blocks pushes the second holder bump to enable the holder moving towards the opening.

3. The flash memory disk according to claim 2, wherein when the holder is located at the second position and the sliding blocks of the pulling ring are sliding along the through sliding groove departing from the side where the opening is located at, said at the least one of the sliding blocks pushes the third holder bump to enable the holder moving towards the containing space.

4. The flash memory disk according to claim 2, wherein
   the holder string strip further comprises a first holder bump disposed thereon, the first holder bump is located between the second holder bump and the plug, and the housing further has at least a housing bump facing the side wall of at least a holder string strip and disposed at the side where the through sliding groove is located at,
   wherein the housing bump is located between the first holder bump and the opening when the holder is located at the first position, and the housing bump is located between the first holder bump and the second holder bump when the holder is located at the second position.

5. The flash memory disk according to claim 4, wherein a side facet of the first holder bump facing the plug has a chamfer, so that the housing bump is locked between the first holder bump and the second holder bump while said at the least one of the sliding blocks pushes the second holder bump and the first holder bump touches the housing bump.

6. The flash memory disk according to claim 5, wherein a side facet of the third holder bump facing the plug has a chamfer, so that the holder string strip swings by an angle and the housing bump is unlocked from the first holder bump while said at the least one of the sliding blocks pushes the third holder bump.

7. The flash memory disk according to claim 2, wherein the holder string strip is an elastic plastic strip or an elastic metal strip.

8. The flash memory disk according to claim 1, wherein the storage device is a flash memory storage device.

9. The flash memory disk according to claim 1, wherein the plug is a USB plug or an IEEE1394 plug.

10. The flash memory disk according to claim 1, wherein the pulling ring is U-shape.

11. The flash memory disk according to claim 1, wherein the through sliding grooves are disposed at upper-down sides of the housing.

12. The flash memory disk according to claim 1, wherein the through sliding grooves are disposed at left-right sides of the housing.

13. The flash memory disk according to claim 1, wherein the holder further forms a hole which could accommodate a sliding block.

14. A method for using a flash memory disk, wherein the flash memory disk comprises a housing having an opening, a holder for disposing a storage device therein, a plug electrically connected to the storage device and a pulling ring having sliding blocks, the method for using a flash memory disk comprises:
   placing the plug and the holder in the housing;
   pulling the pulling ring to slide the sliding blocks to be moved towards the opening so as to protrude the plug out of the housing through the opening;
   rotating the pulling ring so as to avoid the electrical connection between the plug and a host from being affected.

15. The method for using the flash memory disk according to claim 14, wherein the method further comprises:
   fixing the pulling ring.

16. A flash memory disk, comprising:
   a holder for placing a storage device;
   a plug, joined with the holder, exposed out of the holder and electrically connected to the storage device;
   a housing, having a containing space for accommodating the holder and the plug, wherein two sides opposite to each other of the housing respectively have a through sliding groove and another side of the housing has an opening; and
   a pulling ring, having two arms, wherein the two arms respectively have a sliding block moveably matched with the through sliding grooves,
   wherein the pulling ring is rotatable relatively to the housing about an axis connecting both the sliding blocks,
   wherein when the sliding blocks of the pulling ring slide along the through sliding grooves, the holder moves between a first position where the plug is entirely accommodated inside the containing space and a second position where the plug is entirely protruded out of the opening only in one dimension.

* * * * *